US012618906B2

(12) United States Patent
Rayappan et al.

(10) Patent No.: US 12,618,906 B2
(45) Date of Patent: May 5, 2026

(54) METHOD FOR ESTIMATING STATE OF CHARGE OF BATTERY

(71) Applicant: Samsung SDI Co., Ltd., Yongin-si (KR)

(72) Inventors: Christober Rayappan, Yongin-si (KR); Sungwook Paek, Yongin-si (KR); Byeonghui Lim, Yongin-si (KR); Yongjun Hwang, Yongin-si (KR); Jake Kim, Yongin-si (KR); Giheon Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 309 days.

(21) Appl. No.: 18/044,754

(22) PCT Filed: Jun. 14, 2021

(86) PCT No.: PCT/KR2021/007413
§ 371 (c)(1),
(2) Date: Mar. 9, 2023

(87) PCT Pub. No.: WO2022/055080
PCT Pub. Date: Mar. 7, 2022

(65) Prior Publication Data
US 2023/0358810 A1 Nov. 9, 2023

(30) Foreign Application Priority Data
Sep. 11, 2020 (KR) ........................ 10-2020-0117047

(51) Int. Cl.
*G01R 31/36* (2020.01)
*G01R 31/367* (2019.01)
*G01R 31/3842* (2019.01)

(52) U.S. Cl.
CPC ....... *G01R 31/3648* (2013.01); *G01R 31/367* (2019.01); *G01R 31/3842* (2019.01)

(58) Field of Classification Search
CPC ............ G01R 31/3648; G01R 31/3842; G01R 31/367; G01R 31/389; G01R 31/36;
(Continued)

(56) References Cited

U.S. PATENT DOCUMENTS 8,548,761 B2 10/2013 Lim et al.
9,960,625 B2 * 5/2018 Klein ...................... B60L 58/10
(Continued)

FOREIGN PATENT DOCUMENTS

CN 106405433 A 2/2017
CN 106707189 A 5/2017
(Continued)

OTHER PUBLICATIONS

Kim, Gi-Heon, et al., "Efficient and Extensible Quasi-Explicit Modular Nonlinear Multiscale Battery Model: GH-MSMD," Journal of The Electrochemical Society, 2016, vol. 164, No. 6. pp. A1076-A1088.
(Continued)

*Primary Examiner* — Huy Q Phan
*Assistant Examiner* — Martin Walter Braunlich
(74) *Attorney, Agent, or Firm* — Womble Bond Dickinson (US) LLP

(57) ABSTRACT

A method of estimating a state-of-charge (SOC) of a battery includes: setting an initial SOC value and an initial Kalman error covariance value; receiving an estimated G parameter value, a current current value, and a current voltage value of the battery; updating a current SOC value and a current Kalman error covariance value of the battery by inputting the estimated G parameter value, the current current value,
(Continued)

and the current voltage value to an extended Kalman filter; and outputting the current SOC value.

21 Claims, 9 Drawing Sheets

(58) Field of Classification Search
CPC .. G01R 31/382; G01R 31/385; G01R 31/387; G01R 31/3828; G01R 31/374; G01R 31/3835; G01R 31/388; G01R 31/396; H01M 10/48; H01M 10/4285; H01M 10/44; H01M 2010/4271; B60L 58/16; B60L 2260/44; B60L 58/10; B60L 58/12; G06F 17/16; H02J 7/0048
See application file for complete search history.

(56) References Cited

U.S. PATENT DOCUMENTS

| | | | |
|---|---|---|---|
| 10,107,865 B2 | 10/2018 | Choi | |
| 10,664,562 B2* | 5/2020 | Balasingam | G01R 31/3842 |
| 11,231,466 B2 | 1/2022 | Lim | |
| 11,366,171 B2 | 6/2022 | Lim et al. | |
| 11,372,050 B2 | 6/2022 | Kim et al. | |
| 11,567,137 B2 | 1/2023 | Kim | |
| 11,598,816 B2* | 3/2023 | Yazami | H02J 7/005 |
| 11,999,261 B2* | 6/2024 | Kolchin | B60L 58/18 |
| 12,122,262 B2* | 10/2024 | Lee | G01R 31/3842 |
| 2014/0244193 A1 | 8/2014 | Balasingam et al. | |
| 2014/0316728 A1* | 10/2014 | Zhong | G01R 31/374 |
| | | | 702/63 |
| 2017/0176540 A1 | 6/2017 | Omi et al. | |
| 2019/0339333 A1* | 11/2019 | Gelso | G01R 31/3835 |
| 2020/0003841 A1 | 1/2020 | Lim | |
| 2021/0048480 A1 | 2/2021 | Lim et al. | |
| 2022/0196754 A1 | 6/2022 | Kim et al. | |
| 2022/0268856 A1 | 8/2022 | Kim et al. | |
| 2024/0176929 A1* | 5/2024 | Okabe | H01M 10/4285 |

FOREIGN PATENT DOCUMENTS

| | | | |
|---|---|---|---|
| CN | 107064811 A | 8/2017 | |
| CN | 108445402 A | 8/2018 | |
| CN | 110441694 A | 11/2019 | |
| CN | 110716141 A | 1/2020 | |
| CN | 111366855 A | 7/2020 | |
| CN | 112005124 A | 11/2020 | |
| EP | 3015835 A1 | 5/2016 | |
| JP | 2017-026443 A | 2/2017 | |
| KR | 10-1189150 B1 | 10/2012 | |
| KR | 10-1529515 B1 | 6/2015 | |
| KR | 10-1661578 B1 | 10/2016 | |
| KR | 10-2019-0027609 A | 3/2019 | |
| KR | 10-2019-0040412 A | 4/2019 | |
| KR | 10-2019-0123172 A | 10/2019 | |
| KR | 10-2020-0102927 A | 9/2020 | |
| KR | 10-2021-0000206 A | 1/2021 | |
| KR | 10-2021-0000207 A | 1/2021 | |
| WO | WO 2015/133103 A1 | 9/2015 | |
| WO | WO 2019/208924 A1 | 10/2019 | |

OTHER PUBLICATIONS

Li, Wei, et al., "Application of Recursive Least Squares Method for Parameter Identification of DEH Governing System," International Conference on Power Engineering—2007, Oct. 2007, pp. 286-287.

Namor, Emil, et al., "Parameter identification of a lithium-ion cell single-particle model through non-invasive testing," Journal of Energy Storage, 2017, vol. 12, pp. 138-148.

ISR issued Sep. 16, 2021, in corresponding PCT Patent Application No. PCT/KR2021/007413, including English translation (7 pages).

Korean Office action issued Aug. 22, 2022, in corresponding KR Patent Application No. 10-2020-0117047 (54 pages).

EPO Extended European Search Report dated Sep. 26, 2024, issued in corresponding European Patent Application No. 21866951.3, 8 pages.

Chinese Office Action for Application No. 202180055147.9, dated Sep. 10, 2025, 9 pages.

Japanese Office Action dated Mar. 25, 2024, issued in Japanese Patent Application No. 2023-516219, 3 pages.

Kim, Gi-Heon, et al., "Efficient and Extensible Quasi-Explicit Modular Nonlinear Multiscale Battery Model: GH-MSMD", Journal of The Electrochemical Society, 2016, vol. 164, No. 6, pages A1076-A1088.

* cited by examiner

FIG. 3

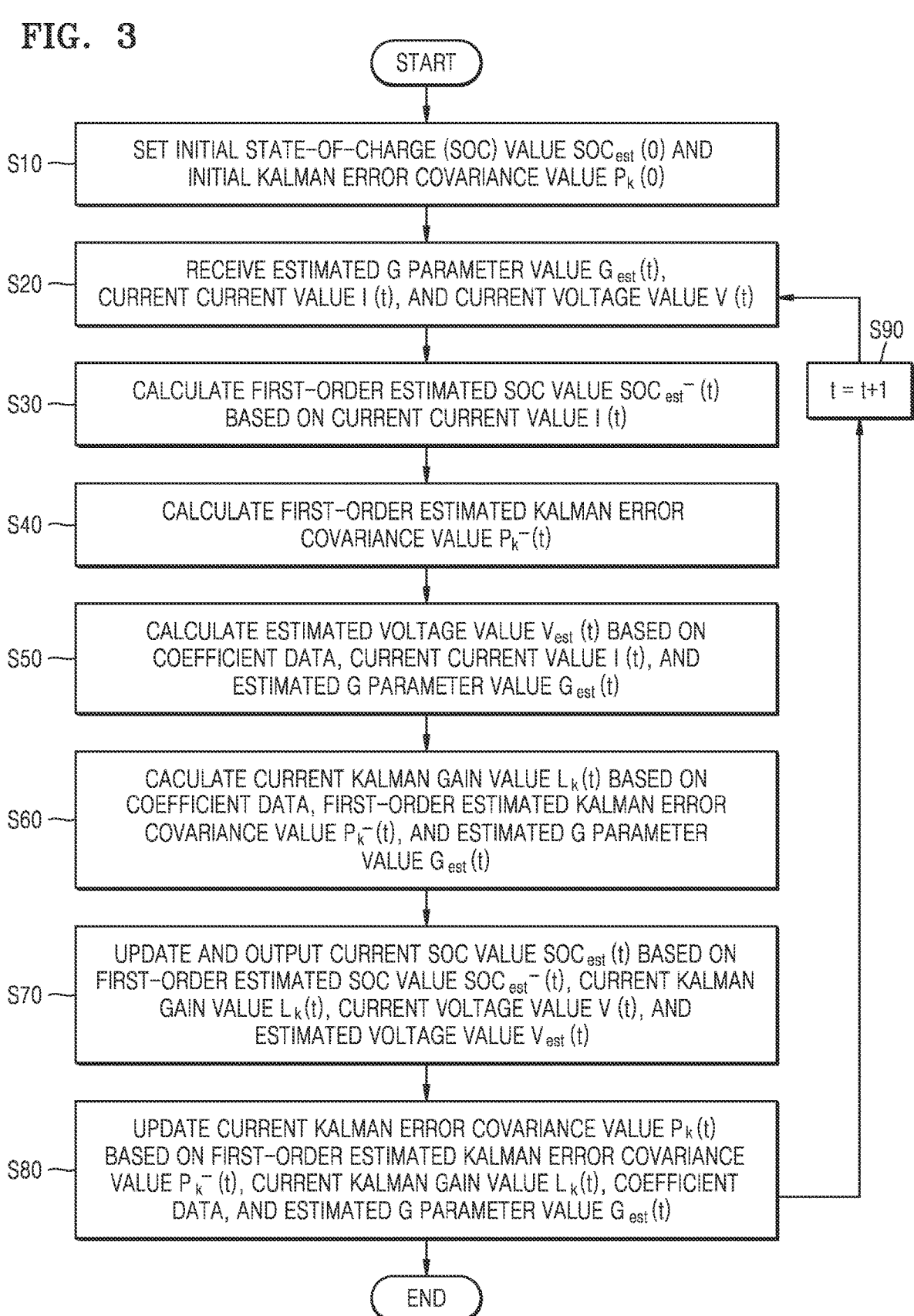

START

S10 — SET INITIAL STATE-OF-CHARGE (SOC) VALUE $SOC_{est}(0)$ AND INITIAL KALMAN ERROR COVARIANCE VALUE $P_k(0)$ S20 — RECEIVE ESTIMATED G PARAMETER VALUE $G_{est}(t)$, CURRENT CURRENT VALUE $I(t)$, AND CURRENT VOLTAGE VALUE $V(t)$ S90    $t = t+1$ S30 — CALCULATE FIRST-ORDER ESTIMATED SOC VALUE $SOC_{est}^-(t)$ BASED ON CURRENT CURRENT VALUE $I(t)$ S40 — CALCULATE FIRST-ORDER ESTIMATED KALMAN ERROR COVARIANCE VALUE $P_k^-(t)$ S50 — CALCULATE ESTIMATED VOLTAGE VALUE $V_{est}(t)$ BASED ON COEFFICIENT DATA, CURRENT CURRENT VALUE $I(t)$, AND ESTIMATED G PARAMETER VALUE $G_{est}(t)$ S60 — CACULATE CURRENT KALMAN GAIN VALUE $L_k(t)$ BASED ON COEFFICIENT DATA, FIRST-ORDER ESTIMATED KALMAN ERROR COVARIANCE VALUE $P_k^-(t)$, AND ESTIMATED G PARAMETER VALUE $G_{est}(t)$ S70 — UPDATE AND OUTPUT CURRENT SOC VALUE $SOC_{est}(t)$ BASED ON FIRST-ORDER ESTIMATED SOC VALUE $SOC_{est}^-(t)$, CURRENT KALMAN GAIN VALUE $L_k(t)$, CURRENT VOLTAGE VALUE $V(t)$, AND ESTIMATED VOLTAGE VALUE $V_{est}(t)$ S80 — UPDATE CURRENT KALMAN ERROR COVARIANCE VALUE $P_k(t)$ BASED ON FIRST-ORDER ESTIMATED KALMAN ERROR COVARIANCE VALUE $P_k^-(t)$, CURRENT KALMAN GAIN VALUE $L_k(t)$, COEFFICIENT DATA, AND ESTIMATED G PARAMETER VALUE $G_{est}(t)$

END

START

S210 — GENERATE SENSED VOLTAGE VALUE $V_{sen}$ AND SENSED CURRENT VALUE $I_{sen}$ BY SENSING VOLTAGE AND CURRENT OF BATTERY

S220 — GENERATE VOLTAGE VALUE V AND CURRENT VALUE I BY USING NOISE FILTER

S230 — TRANSMIT VOLTAGE VALUE V AND CURRENT VALUE I TO GH ESTIMATOR AND TRANSMIT CURRENT VALUE I AND SENSED VOLTAGE VALUE $V_{est}$ TO EKF

END

METHOD FOR ESTIMATING STATE OF CHARGE OF BATTERY

CROSS-REFERENCE TO RELATED APPLICATIONS

This application is a U.S. National Phase Patent Application of International Application Number PCT/KR2021/007413, filed on Jun. 14, 2021, which claims priority of Korean Patent Application Number 10-2020-0117047, filed on Sep. 11, 2020, the entire content of each of which is incorporated herein by reference.

TECHNICAL FIELD

The disclosure relates to a method of estimating a state-of-charge (SOC) of a battery in use.

BACKGROUND ART

Batteries are easily applied to electrical devices and have relatively higher energy, power density, etc., compared with other energy storage devices, and thus, have been widely applied not only to portable electronic devices, but also to electric vehicles (EVs), hybrid electric vehicles (HEVs), or the like, driven by an electrical driving source. Particularly, when an intense output is required, a battery pack in which a plurality of battery cells are serially or parallelly connected with each other may be used.

In order to energy-efficiently and safely use an electrical device driven by a battery or a battery pack, battery management is important, and to this end, accurate measurement and diagnosis of a state of the battery are essential. Currently widely used estimation values include a state-of-charge (SOC) value, a state-of-health (SOH) value, a power limit estimation (PLE) value, etc.

An SOC value according to the related art is represented by the amount of charge of a battery, a remaining capacity of a battery, etc., and is defined by a percentage of a current capacity of a battery to a fully charged capacity of the battery. Methods of estimating an SOC include a method of measuring the amount of charge which is discharged or flows into by using a current sensor and then integrating the amount of charge, a method of using a relationship of an open-circuit voltage (OCV) and an SOC, a method of estimating an SOC by using a battery model, etc.

According to the method of estimating an SOC by measuring the amount of charge which is discharged or flows into by using a current sensor, a current SOC is estimated by adding, to an initial SOC, a value obtained by dividing an integrated current value by a fully charged capacity. This method is also referred to as an Ah counting method or a Coulomb counting method and is widely used because of its simplicity, but this method is affected by the accuracy of the current sensor.

The method of estimating an SOC by measuring an OCV uses an OCV-SOC relationship, which is unique for each battery. The OCV-SOC relationship is known to seldom change even if a battery deteriorates, and thus, the method using this is highly reliable. However, to measure the OCV, a battery has to be left in a zero current state for long, and thus, while the battery is used, the OCV is not able to be measured, and it is difficult to accurately predict the SOC.

When a battery model is used, the effects due to an error (noise) of a current sensor may be minimized, and without a long idle state of a battery, the SOC may be estimated in real time. The battery model includes an equivalent circuit model (ECM), a physics-based model, etc. The ECM is not able to provide an insight into what happens in a battery cell, and a parameter used in the ECM does not actually have a physical indication. The physics-based model is more accurate than the ECM, but has a problem of complexity and convergence.

As described above, previous methods of estimating an SOC have limitations, such as the complexity of a battery model or the suspension of the use of a battery. For preventing over charge and over discharge of a battery and performing cell balancing, it is essential to accurately estimate an SOC. However, the Ah counting method may not guarantee accuracy due to a current measurement error. For example, just based on the assumption that a current sensor has merely an error of 0.1 A, when an electric vehicle is used for 8 hours, an SOC estimation error of 0.8 Ah, that is, the SOC estimation error per week that is equal to or greater than 5 Ah, occurs. When a battery capacity is 100 Ah, the error reaches 5%.

With respect to the SOC estimation, not only accuracy, but also a low calculation load and a high calculation speed are important. When it is possible to accurately estimate and control an internal state of a battery, safety and performance of a battery pack based on price and weight may be improved, so that the battery may be applied not only to vehicles, but also to means of transportation, such as aviation, and other various fields.

DESCRIPTION OF EMBODIMENTS

Technical Problem

The disclosure provides a method of accurately estimating a state-of-charge (SOC) of a battery in real time by using a voltage value and a current value of the battery. The disclosure provides a method of accurately estimating an SOC of a battery in real time by using a G parameter indicating an internal state of the battery. The method of estimating an SOC, according to the disclosure, may be loaded on a battery management system (BMS) and executed by the BMS, and according to the method of estimating an SOC according to the disclosure, an SOC of a battery that is in use may be estimated.

Solution to Problem

According to an aspect of the disclosure, a method of estimating a state-of-charge (SOC) of a battery includes: setting an initial SOC value and an initial Kalman error covariance value; receiving an estimated G parameter value, a current current value, and a current voltage value of the battery; updating a current SOC value and a current Kalman error covariance value of the battery by inputting the estimated G parameter value, the current current value, and the current voltage value to an extended Kalman filter; and outputting the current SOC value. According to an aspect of the disclosure, a method of estimating an SOC of a battery may be executed by a computing device.

Advantageous Effects of Disclosure

A method of estimating a state-of-charge (SOC) of a battery according to various embodiments of the disclosure has great improvements in terms of cost, expandability, and adaptiveness, compared to previous methods. While previous battery-model based methods of estimating an SOC are difficult to be applied to a battery management system (BMS) due to their complexity, the method of estimating an SOC, according to the disclosure, may be actually loaded on a battery management system (BMS).

Moreover, while in the case of the previous methods, the use of the battery has to be suspended in order to increase the accuracy of the SOC, according to the method of estimating an SOC according to the disclosure, an SOC of a battery actually in use may be estimated in real time. In addition, while in the case of the previous methods, the accuracy of the SOC estimation is restricted due to an error of a current sensor, according to the method of estimating an SOC according to the disclosure, because a filter is used, the effects due to the error of the current sensor may be minimized. Also, the method of estimating an SOC, according to the disclosure, may be used not only for a battery cell or a battery pack, but also generally for a battery system.

BRIEF DESCRIPTION OF DRAWINGS

FIG. 3 illustrates a flowchart for describing an operation, performed by an extended Kalman filter, of estimating an SOC, according to an embodiment.

BEST MODE

Figure 1:
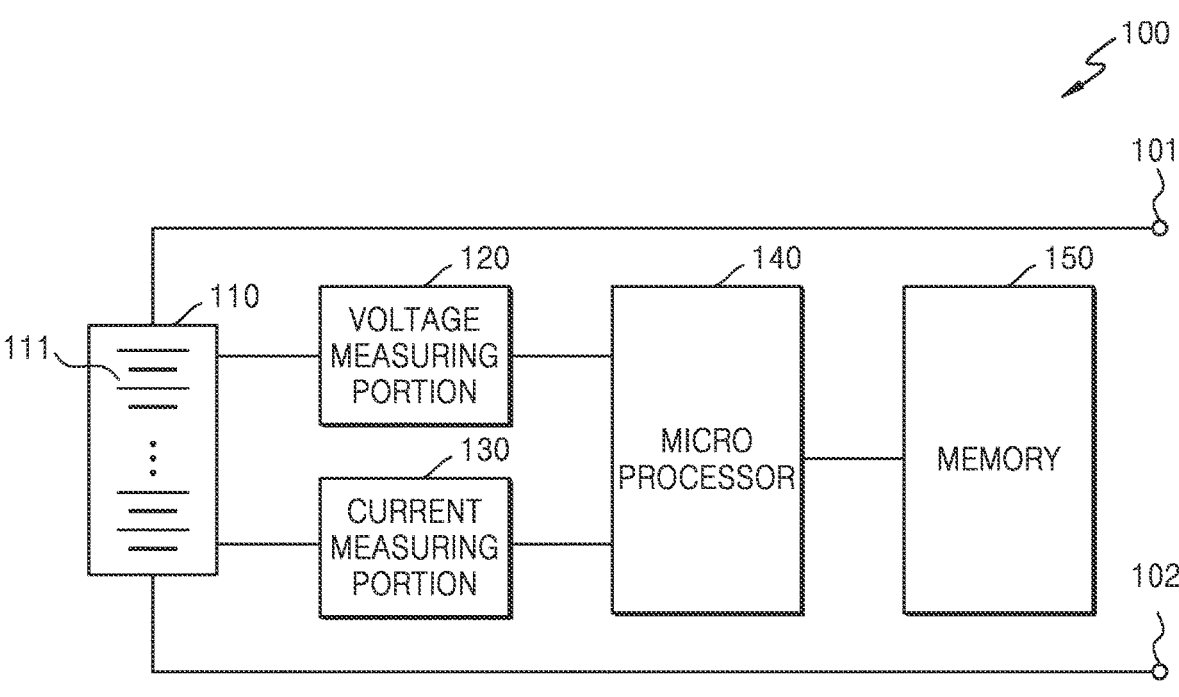
FIG. 1 illustrates a schematic structural diagram of a battery system according to an embodiment.

Advantages and characteristics of the disclosure, and a method of achieving the same will become apparent with reference to the embodiments described in detail with the accompanying drawings. However, the disclosure is not limited to the embodiments provided hereinafter. Rather, the disclosure may be realized in various different forms and shall be understood to include all changes, equivalents, or substitutes included in the concept and the technical scope of the disclosure. The embodiments described below are provided to completely disclose the disclosure so that one of ordinary skill in the art may thoroughly understand the scope of the disclosure. When describing the disclosure, well-known techniques in the art will not be described in detail, when it is determined that the detail descriptions thereof may unnecessarily blur the concept of the disclosure.

Terms used in this specification are used only for describing particular embodiments of the disclosure and are not intended to limit the disclosure. As used herein, the singular terms "a" and "an" are intended to include the plural forms as well, unless the context clearly indicates otherwise. The terms "include," "have," etc. used in this specification shall be understood to indicate the presence of a feature, a number, a step, an operation, a component, a part, or a combination thereof, described in this specification, and shall not be understood to preemptively exclude the presence or the possibility of addition of one or more other features, numbers, steps, operations, components, parts, or combinations thereof. Although the terms first, second, etc. may be used herein to describe various components, these terms do not limit the components. The terms are only used to distinguish one component from another.

Hereinafter, embodiments of the disclosure are described in detail with reference to the accompanying drawings. In the descriptions with reference to the accompanying drawings, like reference numerals refer to the like elements, and the same descriptions are not repeated.

FIG. 1 illustrates a schematic structural diagram of a battery system according to an embodiment.

Referring to FIG. 1, a battery system 100 may include a battery 110, a voltage measuring portion 120, a current measuring portion 130, a microprocessor 140, and a memory 150.

The battery 110 is a portion storing power and includes a plurality of battery cells 111 electrically connected with each other between a first terminal 101 and a second terminal 102. The battery cells 111 may be connected with each other in series or parallel or in series and parallel in a combined manner. The battery cells 111 may have the same volume of capacity and may discharge and charge the same magnitude of current as each other. However, internal states of the battery cells 111 may be different from each other. For example, the battery cells 111 may have different internal resistances and previously-stored power from each other. The battery cells 111 may have different G parameter values and H parameter values from each other. The battery 110 including the battery cells 111 may also have a G parameter value and an H parameter value thereof.

In this disclosure, descriptions are given based on a method of estimating a state-of-charge (SOC) of the battery 110. However, the method of estimating an SOC, according to the disclosure, may also be applied to the estimation of an SOC of each battery cell 111.

The battery cell 111 may include a chargeable secondary battery. For example, the battery cell 111 may include a nickel-cadmium battery, a lead storage battery, a nickel metal hydride (NiMH) battery, a lithium ion battery, a lithium polymer battery, etc. The number of battery cells 111 included in the battery 110 may be determined according to a capacity, an output voltage, and an output current required for the battery 110.

FIG. 1 illustrates one battery 110. However, a plurality of batteries 110 may be parallelly and/or serially connected with each other and connected to a load and/or a charging device through the first and second terminals 101 and 102. Although not illustrated in FIG. 1, the battery 110 may be in use while being connected to a load and/or a charging device. Also, the method of estimating an SOC, according to the disclosure, may also be applied to the estimation of an SOC of all of the plurality of batteries 110 parallelly and/or serially connected with each other.

The battery system 100 may be a battery pack or a battery module including at least one battery cell 111. The battery system 100 may be a system including at least one battery pack or at least one battery module.

The voltage measuring portion 120 may periodically generate a voltage value of the battery 110 by measuring a voltage between both electrodes of the battery 110 for each predetermined sampling period Ts. As another example, the voltage measuring portion 120 may periodically generate a voltage value of each battery cell 111 by measuring a voltage of each battery cell 111 for each sampling period Ts. When the battery cells 111 are connected in parallel with each other, the voltage measuring portion 120 may measure a voltage of only one battery cell 111 and may determine voltage values of all of the battery cells 111 to be the same as each other.

The sampling period Ts may be one second, for example. However, the sampling period Ts may be set to be another time period, for example, 0.1 seconds, 0.5 seconds, 2 seconds, 5 seconds, or 10 seconds. The sampling period Ts may be appropriately set according to an electrical system connected to the battery system 100. A voltage value current measured is referred to as a current voltage value and is indicated as V (t). A voltage value measured before the sampling period Ts is referred to as a direct previous voltage value and is indicated as V (t–1).

The current measuring portion 130 may periodically generate a current value of the battery 110 by measuring a current flowing through the battery 110 for each sampling period Ts. As another example, the current measuring portion 130 may periodically generate a current value of each battery cell 111 by measuring a current of each battery cell 111 for each sampling period Ts. When the battery cells 111 are connected with each other in series, the current measuring portion 130 may measure a current of only one battery cell 111 and may determine current values of all of the battery cells 111 to be the same as each other.

The current value measured by the current measuring portion 130 is indicated as a positive (+) value in the case of a charge current and as a negative (–) value in the case of a discharge current. A current value currently measured is referred to as a current current value and is indicated as I (t), and a current value measured before the sampling period Ts is referred to as a direct previous current value and is indicated as I (t–1). The voltage measuring portion 120 and the current measuring portion 130 may be synchronized with each other and may measure a voltage and a current of the battery 110, respectively, at the same timing.

The microprocessor 140 may estimate an SOC of the battery 110. The microprocessor 140 may be configured to set an initial SOC value $SOC_{est}$ (0) and an initial Kalman error covariance value $P_k$ (0), receive an estimated G parameter value $G_{est}$ (t), a current current value I (t), and a current voltage value V (t) of the battery 110, update a current SOC value $SOC_{est}$ (t) and a current Kalman error covariance value $P_k$ (t) of the battery 110 by inputting the estimated G parameter value $G_{est}$ (t), the current current value I (t), and the current voltage value V (t) to an extended Kalman filter, and output the current SOC value $SOC_{est}$ (t).

Based on the voltage value of the battery 110, provided by the voltage measuring portion 120, and the current value of the battery 110, provided by the current measuring portion 130, the microprocessor 140 may update the estimated G parameter value $G_{est}$ (t) and an estimated H parameter value $H_{est}$ (t), in real time, wherein the estimated G parameter value $G_{est}$ (t) and the estimated H parameter value $H_{est}$ (t) are respectively numerical values of a G parameter and an H parameter indicating a current state of the battery 110. The G parameter is a parameter indicating a degree of sensitivity of voltage with respect to a change of current of the battery 110, and the H parameter is a parameter indicating a valid potential determined by local equilibrium potential distribution and resistance distribution in the battery 110.

By using an adaptive filter, the microprocessor 140 may generate the estimated G parameter value $G_{est}$ (t) and the estimated H parameter value $H_{est}$ (t) in real time based on the voltage value and the current value of the battery 110. The adaptive filter may be a filter using a recursive least square (RLS) method or a filter using a weighted least square (WLS) method. In this specification, an embodiment is described in detail, in which the microprocessor 140 generates the estimated G parameter value $G_{est}$ (t) and the estimated H parameter value $H_{est}$ (t) of the battery 110 based on the voltage value and the current value of the battery 110 by using an RLS filter. However, the disclosure is not limited thereto.

The microprocessor 140 may generate the current SoC value $SOC_{est}$ (t) of the battery 110 in real time by inputting, to the extended Kalman filter, the estimated G parameter value $G_{est}$ (t), the current current value I (t), and the current voltage value V (t) of the battery 110, wherein the estimated G parameter value $G_{est}$ (t) is generated by using the adaptive filter. The microprocessor 140 may use coefficient data stored in the memory 150. The coefficient data may be generated based on an open circuit voltage (OCV)-SOC relationship that is predetermined with respect to the battery 110.

The microprocessor 140 uses only simple operations, such as four fundamental arithmetic operations, in order to generate, in real time, the current SOC value $SOC_{est}$ (t) of the battery 110, and thus, may be included in a battery management system (BMS) loaded in the battery system 100 or a battery pack. As another example, the method of estimating an SOC, according to the present embodiment, may be performed by a microcontroller or an electronic control unit (ECU) of a BMS of an electric vehicle. As another example, the method of estimating an SOC, according to the present embodiment, may be performed by an integrated controller of an energy storage system. As another example, the method of estimating an SOC, according to the present embodiment, may be performed by a processor of a server connected with the battery system or the energy storage system for communication.

The memory 150 may store instructions and data required for the microprocessor 140 to perform the method of estimating an SOC, according to the present embodiment. According to the present embodiment, based on the voltage value and the current value of the battery 110, generated for each sampling period Ts, the estimated G parameter value $G_{est}$ (t) of the battery 110 may be generated, and based on the estimated G parameter value $G_{est}$ (t), the current current value I (t), and the current voltage value V (t), the current SOC value $SOC_{est}$ (t) may be generated. Therefore, the current voltage value, the current current value, a direct previous current value, etc. may be stored in the memory 150, and other voltage and current data may not be stored in the memory 150. The memory 150 may not need to store a large quantity of instructions and data, and thus, the memory 150 may be realized as a small-sized memory. For example, the memory 150 may be realize as a memory in the microprocessor 140.

The disclosure provides the method of estimating an SOC of a battery by using a G parameter and an H parameter, which indicate a current state of the battery. The method of estimating an SOC, according to the disclosure, may be relatively simply realized to be implemented in a BMS and may have high accuracy without additional operation conditions.

The G parameter is a state quantity indicating a degree of sensitivity of voltage of a terminal of a battery cell in use with respect to a change of current applied to the battery cell and has units of resistance. The H parameter is a valid potential determined by local equilibrium potential distribution and resistance distribution in a battery cell in use. The G parameter and the H parameter of the battery cell may be quantized by an explicit correlation formula of a battery material property and design variables by using a theoretical model. Hereinafter, the G parameter and the H parameter of the battery cell are described.

With respect to the battery cell, it may be assumed that voltage V and current I have, for example, a relationship of V=f (I; x, p). Here, x is a physical quantity indicating an internal state of the battery cell, and p is a parameter.

A function f is a nonlinear implicit function, and when the function f is able to be divided into a quantity g rapidly changing and a quantity h slowly changing, the voltage V and the current I may be represented as V=g(I; x, p)+h(I; x, p).

Assuming that there is a function of G(I; x, p)=∂g/∂I slowly changing with respect to the current I, the voltage V and the current I may be represented as V=G(I: x, p)×I+H(I; x, p). Here, ∂g/∂I and ∂H/∂I have very small values. In other words, when the described assumptions are met, G and H are functions slowly changing with respect to the current I, and thus, the function f indicating a nonlinear relationship of the voltage V and the current I may be represented by a quasi-linear relationship as described above.

Here, G is referred to as the G parameter and H is referred to as the H parameter. When the current I is a charge and discharge current, and Ueq is an equilibrium potential of the battery cell, a discharge overvoltage may be represented by Ueq−V=−G×I+(Ueq−H) by using the G parameter G and the H parameter H.

Here, −G×i is an overvoltage generated for a current leakage of the battery through a terminal and includes a reaction dynamic polarization amount and an electron and ion resistance polarization amount, (Ueq−H) is an overvoltage generated because a local thermodynamic equilibrium state in the battery deviates from an equilibrium state of a general system. That is, (Ueq−H) indicates the inefficiency occurring due to thermodynamic non-uniformity in the battery, and when an internal system of the battery reaches the thermodynamic equilibrium state, the H parameter H becomes equal to the equilibrium potential Ueq.

According to the method of estimating an SOC according to embodiments of the disclosure, the G parameter G of the battery may be directly extracted from the voltage value and the current value of the battery, and the SOC of the battery may be estimated by using the G parameter G.

Figure 2:
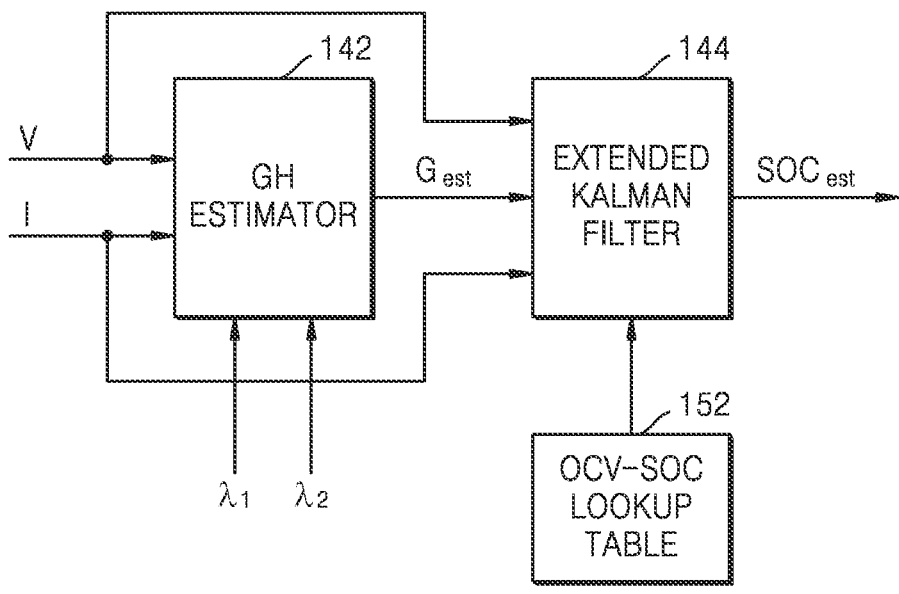
FIG. 2 illustrates a diagram of an internal structure for executing a method of estimating a state-of-charge (SOC), according to an embodiment.

FIG. 2 illustrates a diagram of an internal structure for performing a method of estimating an SOC, according to an embodiment.

Referring to FIG. 2 together with FIG. 1, the microprocessor 140 may include a GH estimator 142 and an extended Kalman filter 144. The memory 150 may store a look-up table 152 generated based on a predetermined OCV-SOC relationship with respect to the battery 110. The look-up table 152 may store coefficient data corresponding to an SOC value. The OCV-SOC relationship is non-linear, and thus, coefficient data corresponding to the OCV-SOC relationship may be stored in the look-up table 152, and the extended Kalman filter 144 may use the coefficient data stored in the look-up table 152 to estimate an SOC of the battery 110. The coefficient data may include first coefficient data or may include second coefficient data and third coefficient data.

The voltage measuring portion 120 of FIG. 1 generates a voltage value V of the battery 110 and provides the voltage value V to the GH estimator 142 and the extended Kalman filter 144. The voltage value V includes a current voltage value V (t) and a direct previous voltage value V (t−1). After the sampling period Ts, the current voltage value V (t) becomes the direct previous voltage value V (t−1), and a new voltage value becomes the current voltage value V (t).

The current measuring portion 130 of FIG. 1 generates the current value I of the battery 110 and provides the current value I to the GH estimator 142 and the extended Kalman filter 144. The current value I includes a current current value I (t) and a direct previous current value I (t−1). After the sampling period Ts, the current current value I (t) becomes the direct previous current value I (t−1), and a new current value becomes the current current value I (t).

The GH estimator 142 generates an estimated G parameter value $G_{est}$ of the battery 110 based on the voltage value V and the current value I by using an adaptive filter. The adaptive filter may be, for example, a filter using an RLS method. The estimated G parameter value $G_{est}$ of the battery 110 is a numerical value of a G parameter indicating a degree of sensitivity of voltage with respect to a change of current of the battery 110. For example, the GH estimator 142 generates an estimated H parameter value $H_{est}$ of the battery 110, based on the voltage value V and the current value I, by using an adaptive filter. The estimated H parameter value $H_{est}$ of the battery 110 is a numerical value of an H parameter indicting a valid potential determined by local equilibrium potential distribution and resistance distribution in the battery 110. The operation of the GH estimator 142 is further described in detail below with reference to FIG. 4.

The extended Kalman filter 144 may receive the estimated G parameter value $G_{est}$ generated by the GH estimator 142, the voltage value V, and the current value I and generate an SOC value $SOC_{est}$ based on the estimated G parameter value $G_{est}$, the voltage value V, and the current value I. The extended Kalman filter 144 may use the coefficient data stored in the look-up table 152. The extended Kalman filter 144 may update the SOC value $SOC_{est}$ and a Kalman error covariance value, in order to output the SOC value $SOC_{est}$ in real time whenever the estimated G parameter value $G_{est}$, the voltage value G, and the current value I are newly input.

According to an embodiment, based on the current current value I (T), a first-order estimated SOC value and a first-order estimated Kalman error covariance value may be calculated. Based on the coefficient data stored in the look-up table 152, the current current value I (t), and the estimated G parameter value $G_{est}$, an estimated voltage value and a current Kalman gain value may be calculated. Based on the first-order estimated SOC value, the current Kalman gain value, the current voltage value V (t), and the estimated voltage value, a current SOC value may be updated. Also, based on the first-order estimated Kalman error covariance value, the current Kalman gain value, the coefficient data, and the estimated G parameter value $G_{est}$ a current Kalman error covariance value may be updated.

The operation of the extended Kalman filter 144 is further described in detail below with reference to FIG. 3.

FIG. 3 illustrates a flowchart of an operation, performed by the extended Kalman filter, of estimating an SOC, according to an embodiment.

Referring to FIGS. 1 through 3, the operation of the extended Kalman filter 144 is performed via the microprocessor 140.

The microprocessor 140 may receive an initial SOC value $SOC_{est}$ (0) and an initial Kalman error covariance value $P_k$ (0) and set the initial SOC value $SOC_{est}$ (0) and the initial Kalman error covariance value $P_k$ (0) in operation S10. The initial SOC value $SOC_{est}$ (0) and the initial Kalman error covariance value $P_k$ (0) are used as a direct previous SOC value $SOC_{est}$ (t–1) and a direct previous Kalman error covariance value $P_k$ (t–1), respectively. A user may input the initial SOC value $SOC_{est}$ (0) by estimating an SOC of the battery 110 or inputting an arbitrary value as the initial SOC value $SOC_{est}$ (0). The user may input an arbitrary value as the initial Kalman error covariance value $P_k$ (0).

The extended Kalman filter 144 of the microprocessor 140 may receive the estimated G parameter value $G_{est}$ (t), the current current value I (t), and the current voltage value V (t) for each sampling period Ts, in operation S20. The microprocessor 140 may input the estimated G parameter value $G_{est}$ (t) generated by the GH estimator 142 to the extended Kalman filter 144. The microprocessor 140 may receive the current voltage value V (t) from the voltage measuring portion 120 and receive the current current value I (t) from the current measuring portion 130.

The microprocessor 140 may calculate a first-order estimated SOC value $SOC_{est}$-(t), based on the direct previous SOC value $SOC_{est}$ (t–1), the current current value I (t), the sampling period Ts, and a maximum capacity $Q_{max}$ of the battery 110. The microprocessor 140 may store information about the sampling period Ts and information about the maximum capacity $Q_{max}$ of the battery 110. The direct previous SOC value $SOC_{est}$ (t–1) corresponds to the current SOC value $SOC_{est}$ (t) before the sampling period Ts. The first-order estimated SOC value $SOC_{est}$-(t) may be calculated based on $SOC_{est}$-(t)=$SOC_{est}$(t–1)+I(t)×Ts/$Q_{max}$.

The microprocessor 140 may calculate the first-order estimated Kalman error covariance value $P_k$-(t), based on the direct previous Kalman error covariance value $P_k$ (t–1), the sampling period Ts, the maximum capacity $Q_{max}$, and processor noise $\sigma_w$ in operation S40. The processor noise $\sigma_w$ may be set by a user according to the specification of a system, for example, as a value between $10^{-6}$ and $10^{-1}$. The processor noise $\sigma_w$, may be set, for example, as 0.0002. The direct previous Kalman error covariance value $P_k$ (t–1) corresponds to the current Kalman error covariance value $P_k$ (t) before the sampling period Ts. The first-order estimated Kalman error covariance value $P_k$-(t) may be calculated based on $P_k$-(t)=$P_k$(t–1)+(Ts/$Q_{max}$)$^2$×$\sigma_w$.

The microprocessor 140 may calculate the estimated voltage value $V_{est}$ (t), based on the coefficient data, the current current value I (t), and the estimated G parameter value $G_{est}$ (t) in operation 850.

According to an embodiment, the microprocessor 140 may extract, from the coefficient data stored in the look-up table 152, a first coefficient value C (t) corresponding to the first-order estimated SOC value $SOC_{est}$-(t) calculated in operation S30.

Figure 5:
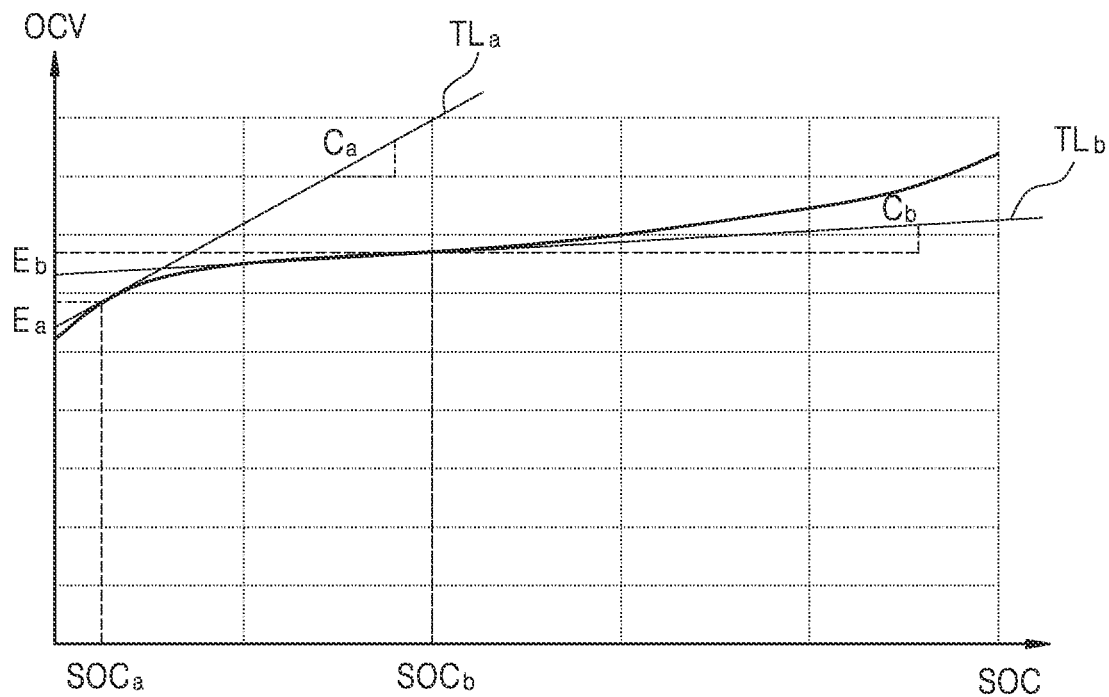
FIG. 5 illustrates an SOC-open circuit voltage (OCV) curve indicating an OCV with respect to an SOC of the battery.

The coefficient data may be generated based on the predetermined OCV-SOC relationship with respect to the battery 110. For example, FIG. 5 illustrates a curve indicating an OCV with respect to an SOC. As illustrated in FIG. 5, the OCV with respect to the SOC is non-linear. The look-up table 152 stores data of the OCV with respect to the SOC, which corresponds to the curve of the OCV with respect to the SOC illustrated in FIG. 5. The look-up table 152 has to be stored in the memory 150, and thus, the look-up table 152 stores some OCV data values corresponding to some SoC data values. For example, some SOC data values may be, for example, 0.01, 0.05, 0.1, 0.2, 0.5, 0.8, 0.9, 0.95, and 0.99, and the look-up table 152 may store the OCV data values respectively corresponding to the SOC data values of 0.01, 0.05, 0.1, 0.2, 0.5, 0.8, 0.9, 0.95, and 0.99, as coefficient data. As another example, some SOC data values may be, for example, multiples of 0.05 or 0.1.

The first coefficient value C (t) may be determined based on an SOC data value $N_\varepsilon$ [$SOC_{est}$-(t)] proximate to the first-order estimated SOC value $SOC_{est}$-(t) and an OCV data value OCV ($N_\varepsilon$ [$SOC_{est}$-(t)]) corresponding to the SOC data value $N_\varepsilon$ [$SOC_{est}$-(t)]. For example, the first coefficient value C (t) may be determined based on C (t)=OCV ($N_\varepsilon$[$SOC_{est}$-(t)])/$N_\varepsilon$[$SOC_{est}$-(t)]. For example, when the first-order estimated SOC value $SOC_{est}$-(t) is 0.11, the SOC data value $N_\varepsilon$[$SOC_{est}$-(t)] proximate to 0.11 may be 0.1 When the OCV data value corresponding to the SOC data value of 0.1 is 3, the first coefficient value C (t) may be 30 corresponding to 3/0.1, and these values may be stored in the memory 150 as the coefficient data. The SOC data value $N_\varepsilon$ [$SOC_{est}$-t)] may be an SOC data value that is most proximate to the first-order estimated SOC value $SOC_{est}$-(t) in the coefficient data.

The microprocessor 140 may calculate the estimated voltage value $V_{est}$ (t), based on the first coefficient value C (t), the first-order estimated SOC value $SOC_{est}$-(t), the estimated G parameter value $G_{est}$ (t), and the current current value I (t). The estimated voltage value $V_{est}$ (t) may be calculated based on $V_{est}$(t)=C(t)×$SOC_{est}$-(t)+$G_{est}$(t)×I(t). C(t)×$SOC_{est}$-(t) corresponds to an OCV value corresponding to the first-order estimated SOC value $SOC_{est}$-(t), and $G_{est}$ (t)×I(t) corresponds to a voltage drop due to a resistance component of the battery 110.

According to another embodiment, the microprocessor 140 may extract, from the coefficient data stored in the look-up table 152, a second coefficient value $C_1$ (t) and a third coefficient value E (t) corresponding to the first-order estimated SOC value $SOC_{est}$-(t) calculated in operation S30. The look-up table 152 may store the coefficient data including the second coefficient value $C_1$ (t) and the third coefficient value E (t) according to the first-order estimated SOC value $SOC_{est}$-(t).

The coefficient data may be determined based on the predetermined OCV-SOC relationship with respect to the battery 110. Referring to the SOC-OCV curve of FIG. 5, indicating the OCV with respect to the SOC, the second coefficient value $C_1$ (t) and the third coefficient value E (t) may be respectively determined to be a gradient and an OCV intercept of a linear function contacting a point of the SOC-OCV curve of FIG. 5, the point corresponding to the SOC data value $N_\varepsilon$ [$SOC_{est}$-(t)] proximate to the first-order estimated SOC value $SOC_{est}$-(t). For example, when the SOC data value $N_\varepsilon$ [$SOC_{est}$-(t)] is $SOC_a$ of FIG. 5, the second coefficient value $C_1$ (t) and the third coefficient value E (t) may be respectively determined to be a gradient $C_a$ and an OCV intercept $E_a$ of a linear function $TL_a$ contacting a point of the SOC-OCV curve, the point corresponding to $SOC_a$. As another example, when the SOC data value $N_\varepsilon$ [$SOC_{est}$-(t)] is $SOC_b$ of FIG. 5, the second coefficient value $C_1$ (t) and the third coefficient value E (t) may be respectively determined to be a gradient $C_b$ and an OCV intercept $E_b$ of a linear function $TL_b$ contacting a point of the SOC-OCV curve, the point corresponding to $SOC_b$.

The microprocessor 140 may calculate the estimated voltage value $V_{est}$ (t) based on the second coefficient value $C_1$ (t), the first-order estimated SOC value $SOC_{est}$-(t), the estimated G parameter value $G_{est}$ (t), the current current value I (t), and the third coefficient value E (t). The estimated voltage value $V_{est}$ (t) may be calculated based on $V_{est}$(t)=$C_1$(t)×$SOC_{est}$-(t)+$G_{est}$(t)×I(t)+E(t). C(t)×$SOC_{est}$-(t)+E(t) corresponds to the OCV value corresponding to the first-order estimated SOC value $SOC_{est}(t)$, and $G_{est}(t) \times I(t)$ corresponds to the voltage drop due to a resistance component of the battery 110.

The microprocessor 140 may calculate a current Kalman gain value $L_k(t)$ based on the coefficient data, the first-order estimated Kalman error covariance value $P_{k^-}(t)$, and the estimated G parameter value $G_{est}(t)$ in operation S60.

The microprocessor 140 may extract, from the coefficient data stored in the look-up table 152, the first coefficient value C (t) corresponding to the first-order estimated SOC value $SOC_{est}(t)$. The first coefficient value C (t) may be the same as the first coefficient value C (t) extracted in operation S50, according to an embodiment, or may be the same as the second coefficient value $C_1$ (t) extracted in operation S50, according to another embodiment.

The microprocessor 140 may calculate the current Kalman gain value $L_k$ (t), based on the first coefficient value C (t), the first-order estimated Kalman error covariance value $P_{k^-}(t)$, the estimated G parameter value $G_{est}$ (t), and measured noise $\sigma_v$. The measured noise $\sigma_v$ may be set by a user according to the specification (for example, the voltage measuring portion 120 and the current measuring portion 130) of a system, for example, as a value between $10^{-1}$ and $10^{-3}$. The measured noise $\sigma_v$ may be set, for example, as 0.01. The current Kalman gain value $L_k$ (t) may be calculated based on $L_k(t) = C(t) \times P_{k^-}(t)/[C(t)^2 \times P_{k^-}(t) + G_{est}(t)^2 \times \sigma_v]$.

The microprocessor 140 may update and output the current SOC value $SOC_{est}$ (t) in operation S70, based on the first-order estimated SOC value $SOC_{est}(t)$ calculated in operation S30, the current Kalman gain value $L_k$ (t) calculated in operation S60, the current voltage value V (t) received in operation S20, and the estimated voltage value $V_{est}$ (t) calculated in operation S50. The current SOC value $SOC_{est}$ (t) may be calculated based on $SOC_{est}(t) = SOC_{est}(t) + L_k(t) \times (V(t) - V_{est}(t))$. The current SOC value $SOC_{est}$ (t) calculated as described above may be output as an estimated SOC value of the battery 110. Since the current SOC value $SOC_{est}$ (t) has to be updated and output in real time after the next sampling period Ts, the current Kalman error covariance value $P_k$ (t) is updated in operation S80.

The microprocessor 140 may update the current Kalman error covariance value $P_k$ (t) based on the first-order estimated Kalman error covariance value $P_{k^-}(t)$, the current Kalman gain value $L_k$ (t), the coefficient data, and the estimated G parameter value $G_{est}$ (t), in operation S80.

The microprocessor 140 may extract, from the coefficient data stored in the look-up table 152, the first coefficient value C (t) corresponding to the first-order estimated SOC value $SOC_{est}(t)$. The first coefficient value C (t) may be the same as the first coefficient value C (t) extracted in operation 850, according to an embodiment, or may be the same as the second coefficient value $C_1$ (t) extracted in operation S50, according to another embodiment.

The microprocessor 140 may calculate the current Kalman error covariance value $P_k$ (t) based on the first-order estimated Kalman error covariance value $P_{k^-}(t)$ calculated in operation S40, the current Kalman gain value $L_k$ (t) calculated in operation S60, the first coefficient value C (t), the estimated G parameter value $G_{est}$ (t) received in operation S20, and the measured noise $\sigma_v$. The current Kalman error covariance value $P_k$ (t) may be calculated based on $P_k(t) = P_{k^-}(t) - L_k(t)^2 \times [C(t)^2 \times Pk^-(t) + G_{est}(t)^2 \times \sigma_v]$.

After the sampling period Ts in operation S90, the microprocessor 140 may proceed to operation S20 and may receive a new estimated G parameter value $G_{est}$ (t), a new current current value I (t), and a new current voltage value V (t) in operation S20. A previous estimated G parameter value $G_{est}$ (t) becomes a direct previous G parameter value $G_{est}$ (t–1), a previous current current value I (t) becomes a direct previous current value I (t–1), and a previous current voltage value V (t) becomes a direct previous voltage value V (t–1). By repeating operations S20 through 880 based on the estimated G parameter value $G_{est}$ (t), the current current value I (t), and the current voltage value V (t) that are newly received, a new current SOC value $SOC_{est}$ (t) may be calculated and output in real time.

Figure 4:
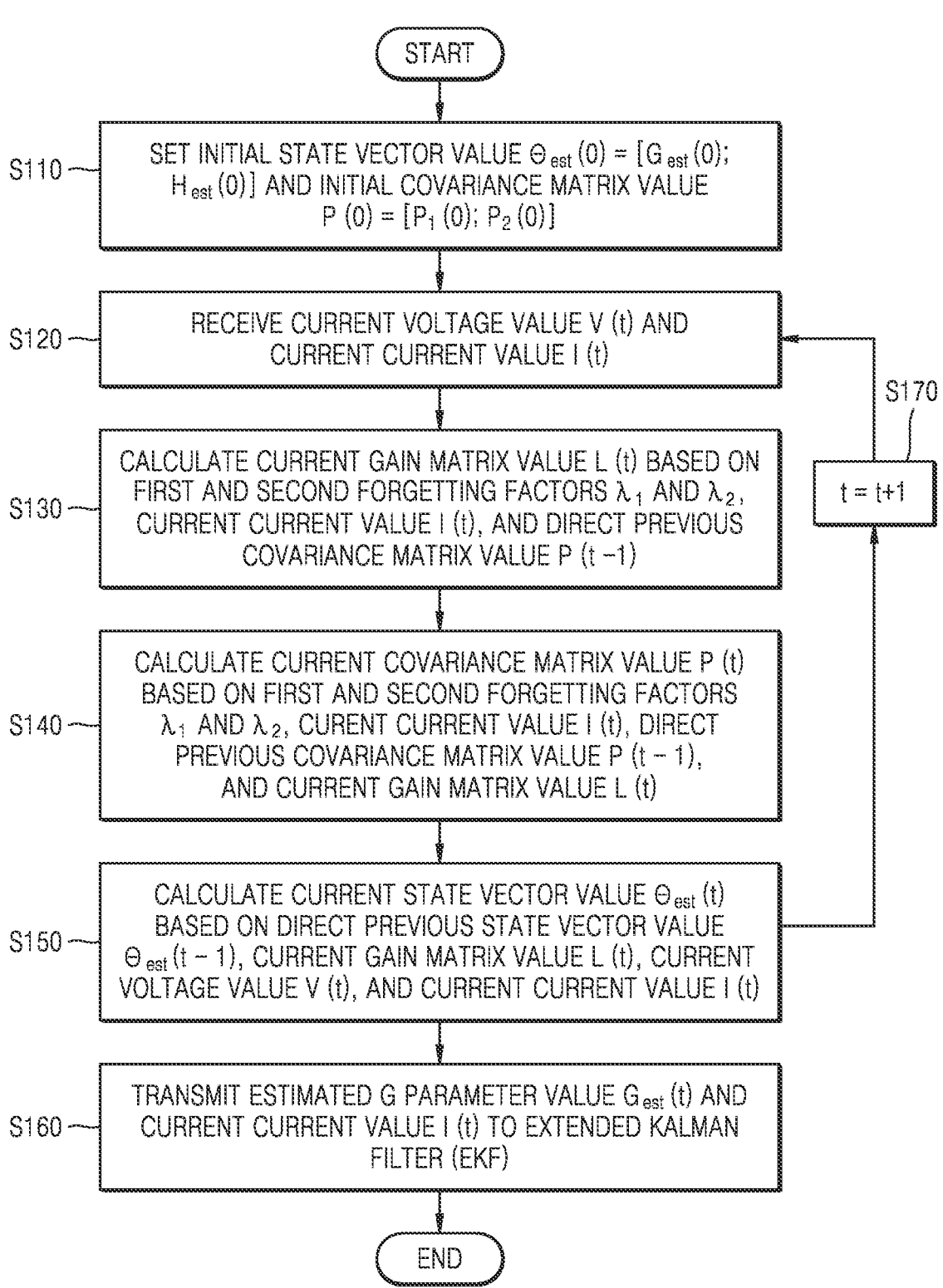
FIG. 4 illustrates a flowchart for describing an operation, performed by a GH estimator, of calculating a G parameter value, according to an embodiment.

FIG. 4 illustrates a flowchart of an operation, performed by a GH estimator, of calculating a G parameter value, according to an embodiment.

An operation of the GH estimator 142 is performed via the microprocessor 140. The microprocessor 140 may estimate a G parameter value and an H parameter value of the battery 110 by using an adaptive filter.

Referring to FIGS. 1, 2, and 4, when the microprocessor 140 uses an RLS filter, the microprocessor 140 may set an initial state vector value $\Theta_{est}(0) = [G_{est}(0); H_{est}(0)]$ and an initial covariance matrix value $P(0) = [P_1(0); P_2(0)]$ in operation S110. The initial state vector value $\Theta_{est}$ (0) and the initial covariance matrix value P (0) are used as a direct previous state vector value $\Theta_{est}$ (t–1) and a direct previous covariance matrix value P (t–1), respectively. A current state vector value $\Theta_{est}$ (t) and a current covariance matrix value P (t) are to be later converged, and thus, a user may input arbitrary values as the initial state vector value $\Theta_{est}$ (0) and the initial covariance matrix value P (0). For example, the initial state vector value $\Theta_{est}$ (0) may be set as $\Theta_{est}(0) = [G_{est}(0); H_{est}(0)] = [1; 1]$, and the initial covariance matrix value P (0) may be set as $P (0) = [P_1(0); P_2 (0)] = [1; 1]$. In this example, both of the initial state vector value $\Theta_{est}$ (0) and the initial covariance matrix value P (0) are initialized as 1. However, it is only an example, and the initial state vector value $\Theta G_{est}$ (0) and the initial covariance matrix value P (0) may be initialized as other values.

The microprocessor 140 may receive a current voltage value V (t) and a current current value I (t) of the battery 110 in operation S120. The voltage measuring portion 120 and the current measuring portion 130 may respectively sense a voltage and a current of the battery 110 for each sampling period Ts and may respectively provide a voltage value and a current value to the microprocessor 140 for each sampling period Ts. The microprocessor 140 may determine a current voltage value or a recently received voltage value as the current voltage value V (t) and may determine a current current value or a recently received current value as the current current value I (t). The current voltage value V (t) and the current current value I (t) of the battery 110 received before the sampling period Ts become a direct previous voltage value V (t–1) and a direct previous current value I (t–1), respectively.

The microprocessor 140 may update the current state vector value $\Theta_{est}(t) = [G_{est}(t); H_{est}(t)]$ and the current covariance matrix value $P(t) = [P_1(t); P_2(t)]$, based on the current voltage value V (t) and the current current value I (t) received for each sampling period Ts. The current state vector value $\Theta_{est}$ (t) of the battery 110 is composed of an estimated G parameter value $G_{est}$ (t) and an estimated H parameter value $H_{est}$ (t) of the battery 110 and is defined as $\Theta_{est}$ (t) = [$G_{est}$ (t); $H_{est}$ (t)]. The current covariance matrix value P (t) is composed of a first covariance matrix value $P_1$ (t) and a second covariance matrix value $P_2$ (t) and is defined as $P(t) = [P_1(t); P_2(t)]$.

The current voltage value V (t) and the current current value I (t) of the battery 110 are received for each sampling period Ts, and the current state vector value $\Theta_{est}$ (t) and the current covariance matrix value P (t) are updated by a recursive method for each sampling period Ts. The microprocessor 140 may update the current state vector value $\Theta_{est}$ (t) for each sampling period Ts, based on the current voltage value V (t) and the current current value I (t) received for each sampling period Ts, by using an RLS method. When the current state vector value $\Theta_{est}$ (t) is updated, the estimated G parameter value $G_{est}$ (t) and the estimated H parameter value $H_{est}$ (t) are determined.

The microprocessor 140 calculates a current gain matrix value L (t), based on first and second forgetting factors $\lambda_1$ and $\lambda_2$, the current current value I (t), and the direct previous covariance matrix value P (t−1) in operation S130.

The current gain matrix value L (t) is used to calculate the current state vector value $\theta_{est}$ (t) and the current covariance matrix value P (t). The gain matrix value L (t) is composed of a first gain matrix value $L_1$ (t) and a second gain matrix value $L_2$ (t) and may be calculated as below.

$$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$

Here, $\lambda_1$ is a first forgetting factor and is related to a G parameter $\lambda_2$ is a second forgetting factor and is related to an H parameter. With respect to the calculation of the estimated G parameter value $G_{est}$ (t) and the estimated H parameter value $H_{est}$ (t), the first and second forgetting factors $\lambda_1$ and $\lambda_2$ are respectively values indicating effects of a previous voltage value and a previous current value on the current estimated G parameter value $G_{est}$ (t) and the current estimated H parameter value $H_{est}$ (t). As the first and second forgetting factors $\lambda_1$ and $\lambda_2$ are closer to 1, the effects on the estimated G parameter value $G_{est}$ (t) and the estimated H parameter value $H_{est}$ (t) are longer, and as the first and second forgetting factors $\lambda_1$ and $\lambda_2$ are closer 0, the effects on the estimated G parameter value $G_{est}$ (t) and the estimated H parameter value $H_{est}$ (t) are shorter.

For example, the first and second forgetting factors $\lambda_1$ and $\lambda_2$ may be greater than or equal to 0.9 and less than or equal to 1. As another example, the first forgetting factor $\lambda_1$ may be set as a value greater than or equal to that of the second forgetting factor $\lambda_2$. For example, the first forgetting factor, $\lambda_1$ may be set as 0.99999, and the second forgetting factor $\lambda_2$ may be set as 0.95. These set values may vary depending on the characteristics of the battery 100.

Inventors of the disclosure found that a highly reliable result is derived when the first and second forgetting factors $\lambda_1$ and $\lambda_2$ are 0.99999 and 0.95, respectively, in an experiment performed on a specific battery cell. However, the above numeral values are example, and different values may be set according to the characteristics of the battery cell 111. For example, the first forgetting factor $\lambda_1$ may be set as 0.9999, and the second forgetting factor $\lambda_2$ may be set as 0.98.

As another example, both of the first and second forgetting factors $\lambda_1$ and $\lambda_2$ may be set as 1. In this case, it may be regarded that the first and second forgetting factors $\lambda_1$ and $\lambda_2$ are not applied.

The microprocessor 140 calculates the current covariance matrix value P (t) based on first and second forgetting factors $\lambda_1$ and $\lambda_2$, the current current value I (t), the direct previous covariance matrix value P (t−1), and the current gain matrix value L (t) in operation S140.

The current covariance matrix value P (t) is used as the direct previous covariance matrix value P (t−1) when the current gain matrix value L (t) is calculated after the sampling period Ts. The current covariance matrix value P (t) may be calculated as below.

$$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix}$$

The microprocessor 140 calculates the current state vector value $\Theta_{est}$ (t) based on the direct previous state vector value $\Theta_{est}$ (t−1), the current gain matrix value L (t), the current voltage value V (t), and the current current value I (t) in operation S150.

The microprocessor 140 may calculate the estimated voltage value $V_{est}$ (t) of the battery 110, based on the current current value I (t) and the direct previous state vector value $\Theta_{est}(t-1)=[G_{est}(t-1); H_{est}(t-1)]$. For example, the estimated voltage value $V_{est}$ (t) may be calculated based on $V_{est}(t) = G_{est}(t-1) \times I(t) + H_{est}(t-1)$ based on the current current value I (t), the direct previous G parameter value $G_{est}$ (t−1), and the direct previous H parameter value $H_{est}$ (t−1).

The microprocessor 140 may calculate a voltage error e (t) based on e (t)=V (t)−$V_{est}$ (t), based on the current voltage value V (t) and the estimated voltage value $V_{est}$ (t).

The microprocessor 140 may calculate the current state vector value $\Theta_{est}$ (t) based on the direct previous state vector value $\Theta_{est}$ (t−1), the current gain matrix value L (t), and the voltage error e (t). For example, the current state vector value $\Theta_{est}$ (t) may be calculated based on $\Theta_{est}(t)=\Theta_{est}(t-1)+L(t) \times e(t)$. As the current state vector value $\Theta_{est}$ (t) is calculated, the estimated G parameter value $\Theta_{est}$ (t) and the estimated H parameter value $H_{est}$ (t) are determined.

The microprocessor 140 may provide the estimated G parameter value $\Theta_{est}$ (t) determined in operation S150 and the current current value I (t) to the extended Kalman filter 144 in operation S160.

The microprocessor 140 may repeatedly perform operations S120 through S150 for each sampling period Ts in operation S170.

$\Theta_{est}(t)=\Theta_{est}(t-1)+L(t) \times e(t)$, which is the formula recursively representing the current state vector value $\Theta_{est}$ (t), may be derived as below.

First, a loss function $\epsilon$, to which the first and second forgetting factors $\lambda_1$ and $\lambda_2$ are applied, is defined as below.

$$\epsilon(G_{est}(t), H_{est}(t), t) =$$

$$\frac{1}{2}\sum_{i=1}^{t}\lambda_1^{t-i}\{V(i) - I(i)G_{est}(t) - H(i)\}^2 + \frac{1}{2}\sum_{i=1}^{t}\lambda_2^{t-i}\{V(i) - I(i)G(i) - H_{est}(t)\}^2$$

Here, V (i) is an $i^{th}$ voltage value, and I (i) is an $i^{th}$ current value. V (t) and I (t) are the current voltage value and the current current value, respectively, and V (t−1) and I (t−1) are the direct previous voltage value and the direct previous current value, respectively.

G (i) and H (i) are an $i^{th}$ actual G parameter value and an $i^{th}$ actual H parameter value, respectively, and $G_{est}$ (t) and $H_{est}$ (t) are a current estimated G parameter value and a current estimated H parameter value, respectively.

When a result of differentiating the loss function $\epsilon$ with respect to each of $G_{est}$ (t) and $H_{est}$ (t) is 0, the loss function $\epsilon$ becomes minimized with respect to $G_{est}$ (t) and $H_{est}$ (t).

$G_{est}$ (t), with respect to which the loss function $\epsilon$ is differentiated to generate a result of 0, is calculated as below.

$$\frac{\partial \epsilon}{\partial G_{est}(t)} = \sum_{i=1}^{t} \lambda_1^{t-i}(-I(i))\{V(i) - I(i)G_{est}(t) - H(i)\} = 0$$

To fix the above formula, $G_{est}$ (t) is as below.

$$G_{est}(t) = \frac{\sum_{i=1}^{t} \lambda_1^{t-i}\{V(i) - H(i)\}}{\sum_{i=1}^{t} \lambda_1^{t-i}I(i)^2}$$

$H_{est}$ (t), with respect to which the loss function $\epsilon$ is differentiated to generate a result of 0, is calculated as below.

$$\frac{\partial \epsilon}{\partial H_{est}(t)} = \sum_{i=1}^{t} \lambda_2^{t-i}(-1)\{V(i) - I(i)G(i) - H_{est}(t)\} = 0$$

To fix the above formula, $H_{est}(t)$ is as below.

$$H_{est}(t) = \frac{\sum_{i=1}^{t} \lambda_2^{t-i}\{V(i) - I(i)G(i)\}}{\sum_{i=1}^{t} \lambda_2^{t-i}}$$

For real time estimation, $G_{est}$ (t) and $H_{est}$ (t) obtained above are fixed in a recursive way by using the current state vector value $\Theta_{est}$ (t) as below.

$$\Theta_{est}(t)=[G_{est}(t);H_{est}(t)]=\Theta_{est}(t-1)+L(t)\times[V(t)-G_{est}(t-1)\times I(t)-H_{est}(t-1)]$$

The estimated voltage value $V_{est}$ (t) may be calculated based on $V_{est}(t)=G_{est}(t-1)\times I(t)+H_{est}(t-1)$, and the voltage error e (t) is defined based on e (t)=V (t)$-V_{est}$ (t), and thus, the current state vector value $\Theta_{est}$ (t) may be represented as below as described above.

$$\Theta_{est}(t)=[G_{est}(t);H_{est}(t)]=\Theta_{est}(t-1)+L(t)\times e(t)$$

Here, the current gain matrix value L (t) and the current covariance matrix value P (t) are calculated as below as described above.

$$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$

$$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix}$$

According to the present embodiment, because the recursive method is used to calculate the G parameter value, the memory 150 stores the current voltage value V (t), the current current value I (t), the current state vector value $\Theta_{est}$ (t), the current covariance matrix value P (t), the first forgetting factor $\lambda_1$, and the second forgetting factor $\lambda_2$ Calculation is very simple, and also, the calculation is possible just via the memory 150 having a small size of about several kB. Because the current state vector value $\Theta_{est}$ (t) and the current covariance matrix value P (t) are periodically updated, changes of voltage and current of the battery 110 may be reflected in real time in the estimated G parameter value $G_{est}$ (t) and the estimated H parameter value $H_{est}$ (t).

Figure 6:
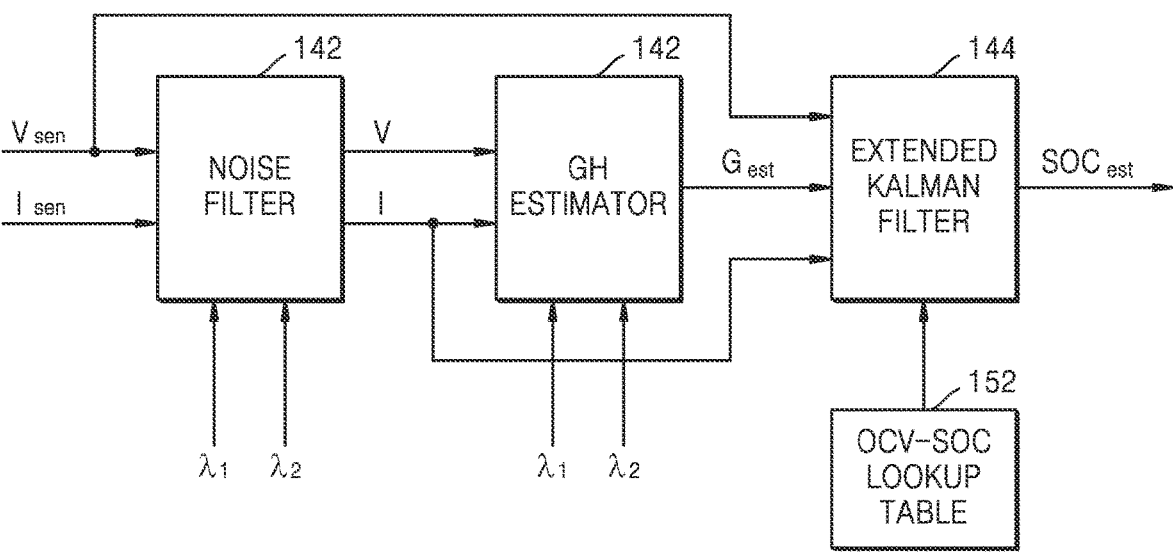
FIG. 6 illustrates a diagram of an internal structure for executing a method of estimating an SOC, according to another embodiment.

FIG. 6 illustrates a diagram of an internal structure for executing a method of estimating an SOC, according to another embodiment.

Referring to FIG. 6, the microprocessor 140 may further include a noise filter 146, in addition to the GH estimator 142 and the extended Kalman filter 144. The GH estimator 142 and the extended Kalman filter 144 are described above, and thus, their descriptions are not repeated.

According to the present embodiment, a sensed voltage value Vsen corresponding to a voltage sensed by the voltage measuring portion 120 may be input to the noise filter 146, and the noise filter 146 may output a voltage value V corresponding to the sensed voltage value Vsen. The voltage value V includes a direct previous voltage value V (t−1) and a current voltage value V (t). A sensed current value Isen corresponding to a current sensed by the current measuring portion 130 may be input to the noise filter 146, and the noise filter 146 may output a current value I corresponding to the sensed current value Isen. The current value I includes a direct previous current value I (t−1) and a current current value I (t).

The noise filter 146 may remove noise in the sensed voltage value Vsen and the sensed current value Isen and may output the voltage value V and the current value I from which the noise is removed. The noise filter 146 may be, for example, a row pass filter. The noise filter 146 may be a mobile average filter. The noise filter 146 may be an infinite impulse response (IIR) filter or a finite impulse response (FIR) filter.

The voltage value V and the current value I output from the noise filter 146 may be input to the GH estimator 142. The sensed voltage value Vsen input to the noise filter 146 and the current value I output from the noise filter 146 may be input to the extended Kalman filter 144. The sensed voltage value Vsen and the current value I input to the extended Kalman filter 144 correspond to the current voltage value V (t) and the current current value I (t), respectively.

Figure 7:
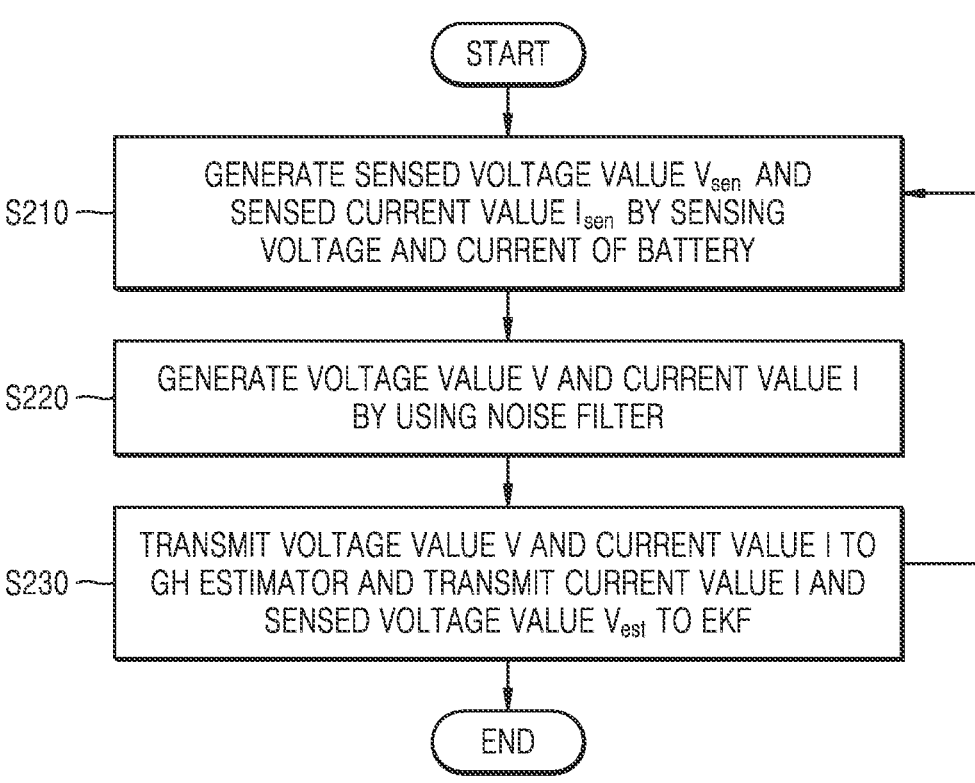
FIG. 7 illustrates a flowchart for describing an operation of a noise filter, according to another embodiment.

FIG. 7 illustrates a flowchart for describing an operation of a noise filter, according to another embodiment.

Referring to FIG. 7, a sensed voltage value Vsen corresponding to a voltage of the battery 110, the voltage being sensed by the voltage measuring portion 120, is generated, and a sensed current value Isen corresponding to a current of the battery 110, the current being sensed by the current measuring portion 120, is generated, in operation S210.

Each of the sensed voltage value Vsen and the sensed current value Isen is input to the noise filter 146, and a voltage value V from which noise is filtered and a current value I from which noise is filtered are generated in operation S220.

The voltage value V and the current value I are transmitted to the GH estimator 142, and the current value I and the sensed voltage value Vsen are transmitted to the extended Kalman filter 144. The sensed voltage value Vsen and the current value I input to the extended Kalman filter 144 correspond to the current voltage value V (t) and the current current value I (t), respectively.

Figure 8:
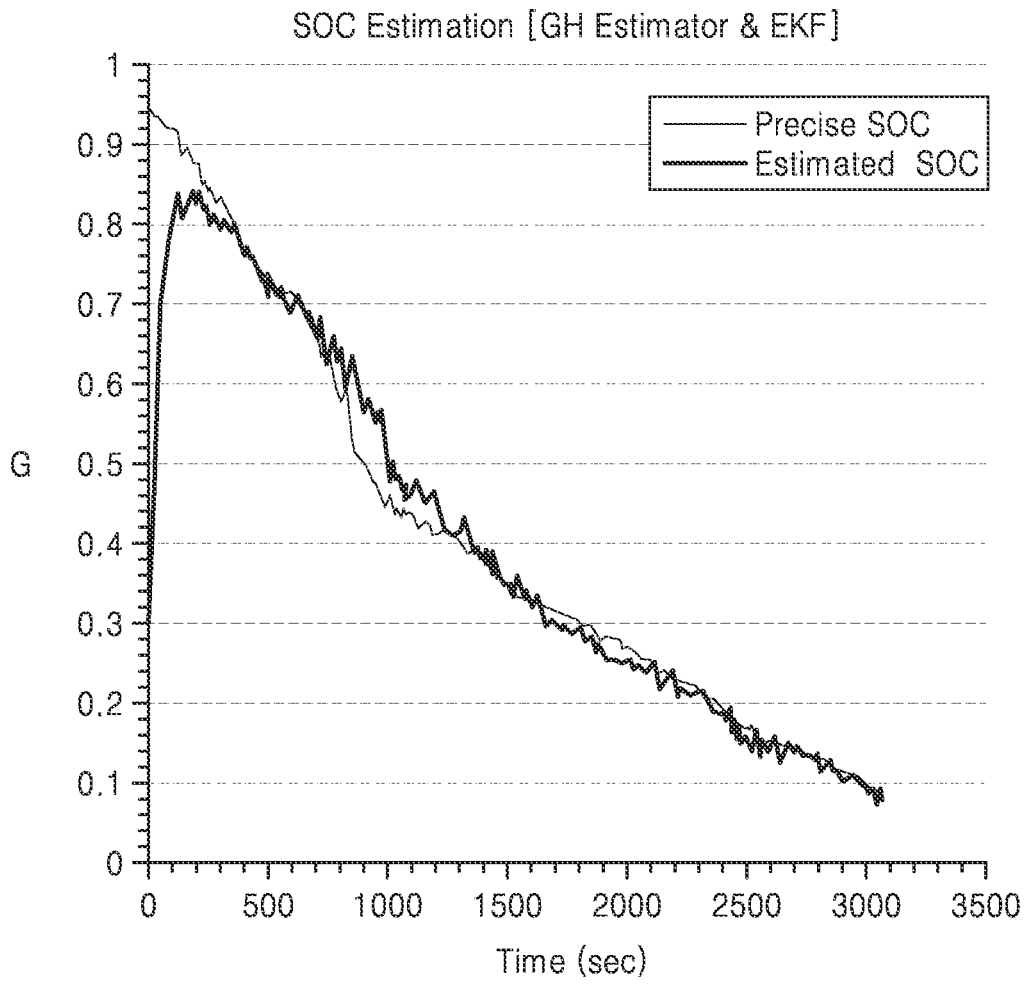
FIG. 8 is a graph for comparing an estimated SOC value according to the disclosure with an actual SOC value of a battery.
Figure 9:
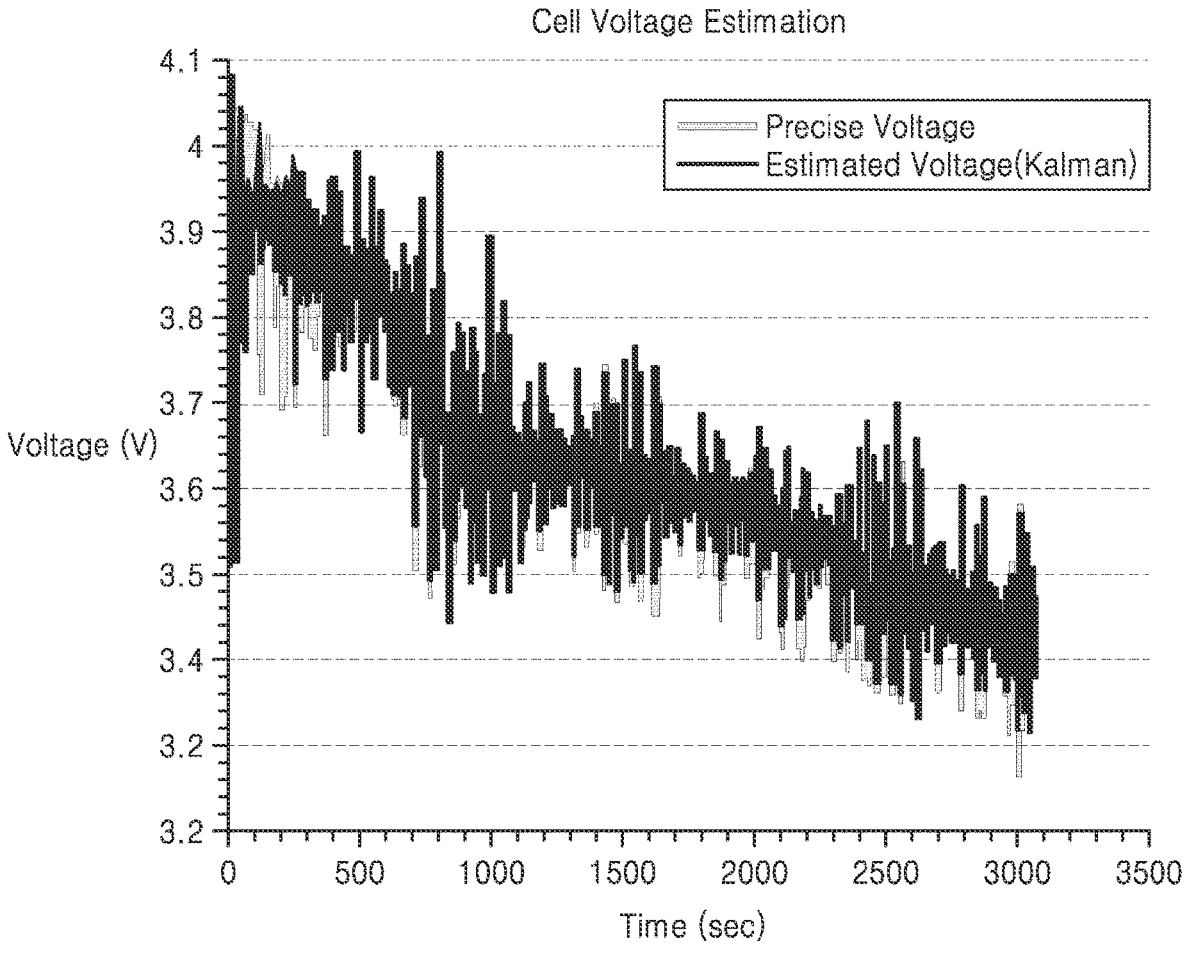
FIG. 9 is a graph for comparing an estimated cell voltage according to the disclosure with an actual cell voltage of a battery.

FIG. 8 is a graph of a comparison between an estimated SoC value according to an embodiment and an actual SOC value of a battery, and FIG. 9 is a graph of a comparison between an estimated cell voltage according to an embodiment and an actual cell voltage of a battery.

As illustrated in FIG. 8, although an initial SOC value is set as 0.3, the estimated SOC values according to an embodiment follow the actual SOC values after about 400 seconds. A gap between the estimated SOC values and the actual SOC values decreases as time passes. The method according to the disclosure uses a simple calculation, and thus, the method may be driven by a processor having a low specification, and also, according to the method, an SOC of a battery may be highly accurately estimated.

As illustrated in FIG. 9, it is identified that the estimated cell voltages according to the disclosure follow the actual cell voltages. It is identified that because the estimation algorithm of the disclosure is accurate, the method may be actually applied to various products.

The concept of the disclosure shall not be defined by being limited to the embodiments described above. Also, in addition to the claims described below, all scopes that are equivalent to the claims or equivalently changed therefrom shall be regarded as the concept of the disclosure.

The invention claimed is:

1. A method of estimating a state-of-charge (SOC) of a battery, the method comprising:
setting an initial SOC value and an initial Kalman error covariance value;
generating, by a first filter, an estimated G parameter value based on a first current value and a first voltage value, wherein the estimated G parameter value is indicative of an estimated internal state of the battery;
receiving, by an extended Kalman filter, the estimated G parameter value, the first current value, and the first voltage value of the battery;
generating, by the extended Kalman filter, a current SOC value and a current Kalman error covariance value of the battery based on the estimated G parameter value, the first current value, and the first voltage value, wherein the generating includes:
calculating a first-order estimated SOC value based on the first current value and the initial SOC value;
calculating a first-order estimated Kalman error covariance value based on the first current value and the initial Kalman error covariance value;
identifying coefficient data associated with an open circuit voltage (OCV)-SOC relationship for the battery;
calculating an estimated voltage value based on the coefficient data, the first current value, and the estimated G parameter value;
calculating a current Kalman gain value based on the coefficient data, the estimated G parameter value, and the first-order estimated Kalman error covariance value;
computing the current SOC value based on the first-order estimated SOC value, the current Kalman gain value, the first voltage value, and the estimated voltage value; and
computing the current Kalman error covariance value based on the first-order estimated Kalman error covariance value, the current Kalman gain value, the coefficient data, and the estimated G parameter value;
outputting the current SOC value; and
managing safety of an electrical device driven by the battery based on the current SOC value.

2. The method of estimating a state-of-charge (SOC) of a battery of claim 1, wherein the first-order estimated SOC value $SOC_{est^-}(t)$ is calculated based on $SOC_{est^-}(t)=SOC_{est}(t-1)+I(t)\times Ts/Q_{max}$, by using a direct previous SOC value $SOC_{est}(t-1)$, the first current value I (t), a sampling period Ts, and a maximum capacity $Q_{max}$ of the battery.

3. The method of estimating a state-of-charge (SOC) of a battery of claim 1, wherein the first-order estimated Kalman error covariance value $P_{k^-}(t)$ is calculated based on $P_{k^-}(t)$ $=P_k(t-1)+(Ts/Q_{max})^2\times\sigma_w$, by using a direct previous Kalman error covariance value $P_k$ (t-1), a sampling period Ts, a maximum capacity $Q_{max}$ of the battery, and processor noise $\sigma_w$.

4. The method of estimating a state-of-charge (SOC) of a battery of claim 1, wherein the calculating of the estimated voltage value comprises:
extracting, from the coefficient data, a first coefficient value C (t) corresponding to the estimated SOC value $SOC_{est^-}(t)$; and
calculating the estimated voltage value $V_{est}$ (t) based on $V_{est}(t)=C(t)\times SOC_{est^-}(t)+G_{est}(t)\times I(t)$, by using the first coefficient value C (t), the first-order estimated SOC value $SOC_{est^-}(t)$, the estimated G parameter value $G_{est}$ (t), and the first current value I (t).

5. The method of estimating a state-of-charge (SOC) of a battery of claim 4, wherein the first coefficient value C (t) is determined based on $C(t)=OCV(N_\varepsilon[SOC_{est^-}(t)])/N_\varepsilon[SOC_{est^-}(t)]$, by using an SOC data value $N_\varepsilon$ $[SOC_{est^-}(t)]$ proximate to the first-order estimated SOC value $SOC_{est^-}(t)$ and an OCV data value OCV $(N_\varepsilon[SOC_{est^-}(t)])$ corresponding to the SOC data value $N_\varepsilon$ $[SOC_{est^-}(t)]$.

6. The method of estimating a state-of-charge (SOC) of a battery of claim 1, wherein the calculating of the estimated voltage value comprises:
extracting, from the coefficient data, a second coefficient value $C_1$ (t) and a third coefficient value E (t) corresponding to the first-order estimated SOC value $SOC_{est^-}(t)$; and
calculating the estimated voltage value $V_{est}$ (t) based on $V_{est}(t)=C_1(t)\times SOC_{est^-}(t)+G_{est}(t)\times I(t)+E(t)$, by using the second coefficient value $C_1$ (t), the first-order estimated SOC value $SOC_{est^-}(t)$, the estimated G parameter value $G_{est}$ (t), the first current value I (t), and the third coefficient value E (t).

7. The method of estimating a state-of-charge (SOC) of a battery of claim 6, wherein the second coefficient value $C_1$ (t) and the third coefficient value E (t) are respectively determined to be a gradient and an OCV intercept of a linear function contacting a point in a curve corresponding to an OCV-SOC relationship, the point corresponding to an SOC data value $N_\varepsilon$ $[SOC_{est^-}(t)]$ proximate to the first-order estimated SOC value $SOC_{est^-}(t)$.

8. The method of estimating a state-of-charge (SOC) of a battery of claim 1, wherein the calculating of the current Kalman gain value comprises:
extracting, from the coefficient data, a first coefficient value C (t) corresponding to the first-order estimated SOC value $SOC_{est^-}(t)$; and
calculating the current Kalman gain value $L_k$ (t) based on $L_k(t)=C(t)\times P_{k^-}(t)/[C(t)^2\times P_{k^-}(t)+G_{est}(t)^2\times\sigma_v]$, by using the first coefficient value C (t), the first-order estimated Kalman error covariance value $P_{k^-}(t)$, the estimated G parameter value $G_{est}$ (t), and measured noise $\sigma_v$.

9. The method of estimating a state-of-charge (SOC) of a battery of claim 1, wherein the current SOC value $SOC_{est}$ (t) is calculated based on $SOC_{est}(t)=SOC_{est^-}(t)+L_k(t)\times(V(t)-V_{est}(t))$, by using the first-order estimated SOC value $SOC_{est^-}(t)$, the current Kalman gain value $L_k$ (t), the first voltage value V (t), and the estimated voltage value $V_{est}$ (t).

10. The method of estimating a state-of-charge (SOC) of a battery of claim 1, wherein the calculating of the current Kalman error covariance value comprises:
extracting, from the coefficient data, a first coefficient value C (t) corresponding to the first-order estimated SOC value $SOC_{est^-}(t)$; and

calculating the current Kalman error covariance value $P_k$ (t) based on $P_k(t)=P_k^-(t)-L_k(t)^2\times[C(t)^2\times P_k^-(t)+G_{est}(t)^2\times \sigma_v]$, by using the first-order estimated Kalman error covariance value $P_k^-(t)$, the current Kalman gain value $L_k$ (t), the first coefficient value C (t), the estimated G parameter value $G_{est}$ (t), and measured noise $\sigma_v$.

11. The method of estimating a state-of-charge (SOC) of a battery of claim 1, further comprising:

sensing a voltage and a current of the battery for each predetermined sampling period Ts and periodically generating a voltage value and a current value of the battery; and generating the estimated G parameter value from the voltage value and the current value by using an adaptive filter, wherein the estimated G parameter value is a numerical value of a G parameter indicating a degree of sensitivity of voltage with respect to a change of current of the battery.

12. The method of estimating a state-of-charge (SOC) of a battery of claim 11, wherein the adaptive filter is a filter using a recursive least square (RLS) method.

13. The method of estimating a state-of-charge (SOC) of a battery of claim 11, further comprising generating an estimated H parameter value from the first voltage value and the first current value by using the adaptive filter, wherein the estimated H parameter value is a numerical value of an H parameter indicating a valid potential determined by local equilibrium potential distribution and resistance distribution in the battery.

14. The method of estimating a state-of-charge (SOC) of a battery of claim 13, further comprising setting an initial state vector value and an initial covariance matrix value of the battery, wherein the periodical generating of the voltage value and the current value of the battery comprises:

generating a direct previous voltage value and a direct previous current value of the battery; and generating the first voltage value and the first current value of the battery after the sampling period Ts.

15. The method of estimating a state-of-charge (SOC) of a battery of claim 14, wherein the generating of the estimated G parameter value and the estimated H parameter value comprises:

calculating an estimated voltage value of the battery based on the first current value and a direct previous state vector value;

calculating a current gain matrix value and a current covariance matrix value based on the first current value and a direct previous covariance matrix value;

calculating a voltage error based on the first voltage value and the estimated voltage value; and generating the estimated G parameter value and the estimated H parameter value by calculating a current state vector value based on the direct previous state vector value, the current gain matrix value, and the voltage error.

16. The method of estimating a state-of-charge (SOC) of a battery of claim 15, wherein the estimated voltage value $V_{est}$ (t) is calculated based on $V_{est}(t)=G_{est}(t-1)\times I(t)+H_{est}(t-1)$, by using the first current value I (t), a direct previous G parameter value $G_{est}$ (t−1), and a direct previous H parameter value $H_{est}$ (t−1).

17. The method of estimating a state-of-charge (SOC) of a battery of claim 15, wherein the current state vector value $\Theta_{est}$ (t) is calculated based on $\Theta_{est}(t)=\Theta_{est}(t-1)+L(t)\times e(t)$, by using the direct previous state vector value $\Theta_{est}$ (t−1), the current gain matrix value L (t), and the voltage error e (t).

18. The method of estimating a state-of-charge (SOC) of a battery of claim 15, wherein the generating of the estimated G parameter value and the estimated H parameter value further comprises receiving a first forgetting factor $\lambda_1$ related to the G parameter and a second forgetting factor $\lambda_2$ related to the H parameter.

19. The method of estimating a state-of-charge (SOC) of a battery of claim 18, wherein the current gain matrix value is calculated by the following equation:

$$L(t)=\begin{bmatrix}L_1(t)\\L_2(t)\end{bmatrix}=\frac{1}{1+P_1(t-1)I(t)^2/\lambda_1+P_2(t-1)/\lambda_2}\begin{bmatrix}P_1(t-1)I(t)/\lambda_1\\P_2(t-1)/\lambda_2\end{bmatrix},$$

and the current covariance matrix value is calculated by the following equation:

$$P(t)=\begin{bmatrix}P_1(t)\\P_2(t)\end{bmatrix}=\begin{bmatrix}\{1-L_1(t)I(t)\}P_1(t-1)/\lambda_1\\\{1-L_2(t)\}P_2(t-1)/\lambda_2\end{bmatrix}$$

where L (t) is the current gain matrix value, P (t) is the current covariance matrix value, P (t−1) is the direct previous covariance matrix value, I (t) is the first current value, $\lambda_1$ is the first forgetting factor, and $\lambda_2$ is the second forgetting factor.

20. The method of estimating a state-of-charge (SOC) of a battery of claim 1, further comprising:

sensing a voltage and a current of the battery for each predetermined sampling period Ts and generating a sensed voltage value and a sensed current value of the battery;

periodically generating a voltage value and a current value of the battery by inputting each of the sensed voltage value and the sensed current value to a noise filter; and generating the estimated G parameter value and an estimated H parameter value from the voltage value and the current value by using an adaptive filter, wherein the estimated G parameter value is a numerical value of a G parameter indicating a degree of sensitivity of voltage with respect to a change of current of the battery, and the estimated H parameter value is a numerical value of an H parameter indicating a valid potential determined by local equilibrium potential distribution and resistance distribution in the battery.

21. The method of estimating a state-of-charge (SOC) of a battery of claim 20, wherein the receiving of the first current value and the first voltage value comprises:

receiving the sensed current value as the first current value; and receiving the sensed voltage value as the first voltage value.

* * * * *